US009300079B2

(12) United States Patent
Radeke et al.

(10) Patent No.: US 9,300,079 B2
(45) Date of Patent: Mar. 29, 2016

(54) DEVICE FOR ELECTRICALLY CONNECTING AND ATTACHING AN ELECTRICAL DEVICE TO A WALL IN A VEHICLE

(71) Applicant: AIRBUS OPERATIONS GMBH, Hamburg (DE)

(72) Inventors: Frank Radeke, Hamburg (DE); Hartwig Jaeger, Jork (DE); Christian Schlosser, Clausthal-Zellerfeld (DE); Martin Jean-Jacques, Hamburg (DE)

(73) Assignee: AIRBUS OPERATIONS GMBH, Hamburg (DE)

( * ) Notice: Subject to any disclaimer, the term of this patent is extended or adjusted under 35 U.S.C. 154(b) by 21 days.

(21) Appl. No.: 13/792,706

(22) Filed: Mar. 11, 2013

(65) Prior Publication Data

US 2013/0280953 A1   Oct. 24, 2013

Related U.S. Application Data

(63) Continuation of application No. PCT/EP2011/066140, filed on Sep. 16, 2011.

(60) Provisional application No. 61/383,449, filed on Sep. 16, 2010.

(30) Foreign Application Priority Data

Sep. 16, 2010   (DE) .......................... 10 2010 045 590

(51) Int. Cl.
*H01R 13/64* (2006.01)
*H01R 13/60* (2006.01)
(Continued)

(52) U.S. Cl.
CPC .............. *H01R 13/60* (2013.01); *H05K 5/0026* (2013.01); *H05K 7/1412* (2013.01)

(58) Field of Classification Search
CPC ............. H01R 2201/26; H01R 13/193; H01R 13/629; H01R 13/6315
USPC .................... 439/34, 247, 248, 342, 376, 929
See application file for complete search history.

(56) References Cited

U.S. PATENT DOCUMENTS 5,771,575 A * 6/1998 Onizuka et al. ................. 29/868
5,848,902 A * 12/1998 Yamaguchi et al. ............ 439/34
(Continued)

FOREIGN PATENT DOCUMENTS

CN         1959855 B    12/2010
DE         20310556 U1  10/2003
(Continued)

OTHER PUBLICATIONS

International Searching Authority, International Search Report for International Application No. PCT/EP2011/066140 dated Jan. 3, 2012.
(Continued)

*Primary Examiner* — Thanh Tam Le
(74) *Attorney, Agent, or Firm* — Ingrassia Fisher & Lorenz, P.C.

(57) ABSTRACT

An apparatus for electrically connecting and attaching an electrical device to a wall in a vehicle is provided. The apparatus provides a universal base plate with a first connection region with a first electrical connector arranged therein and a universal rear wall with a second connection region with a second electrical connector positioned therein. The universal base plate comprises attachment means for attachment to a wall in a vehicle, wherein the universal rear wall is designed to form part of an electrical device or to be attached thereto. The rear wall and the base plate comprise largely corresponding directions of extension and are designed to be brought into mechanical engagement with each other, wherein during mechanical engagement the first and the second connection regions are arranged adjacent to each other in such a manner that the first electrical connector and the second electrical connector establish a mutual connection.

14 Claims, 7 Drawing Sheets

(51) Int. Cl.
*H05K 5/00* (2006.01)
*H05K 7/14* (2006.01)

(56) References Cited

U.S. PATENT DOCUMENTS

| | | | |
|---|---|---|---|
| 6,083,027 A * | 7/2000 | Sato | 439/341 |
| 6,217,363 B1 * | 4/2001 | Takata | 439/342 |
| 6,346,007 B2 * | 2/2002 | Yokoi | 439/564 |
| 6,462,279 B1 * | 10/2002 | Serizawa et al. | 174/72 A |
| 6,682,356 B2 * | 1/2004 | Erez et al. | 439/108 |
| 7,011,542 B2 | 3/2006 | Suzuki et al. | |
| 7,594,823 B2 * | 9/2009 | Moscovitch | 439/374 |
| 7,606,026 B2 * | 10/2009 | Quijano et al. | 439/131 |
| 7,704,077 B1 * | 4/2010 | Morley | 439/63 |
| 7,780,114 B2 | 8/2010 | Doebertin et al. | |
| 8,164,215 B2 | 4/2012 | Bauer et al. | |
| 8,328,562 B1 * | 12/2012 | Rassoolkhani et al. | 439/34 |
| 8,360,795 B2 * | 1/2013 | Moore | 439/342 |
| 8,535,102 B1 * | 9/2013 | Colahan et al. | 439/638 |
| 8,721,356 B2 * | 5/2014 | Webb et al. | 439/248 |

FOREIGN PATENT DOCUMENTS

| | | |
|---|---|---|
| DE | 202008014610 U1 | 12/2009 |
| DE | 102009023317 A1 | 1/2010 |
| DE | 102009008847 A1 | 8/2010 |
| WO | 9840242 A1 | 9/1998 |
| WO | 0038951 A1 | 7/2000 |

OTHER PUBLICATIONS

State Intellectual Property Office of the People's Republic of China, Office Action in Chinese Patent Application No. 201180044596.X, mailed Dec. 29, 2014.
State Intellectual Property Office of the People's Republic of China, Office Action in Chinese Patent Application No. 201180044596.X, mailed Sep. 1, 2015.
French Patent Office, French Search Report for French Patent Application No. 11 763 891.6 mailed on Dec. 7, 2015.

* cited by examiner

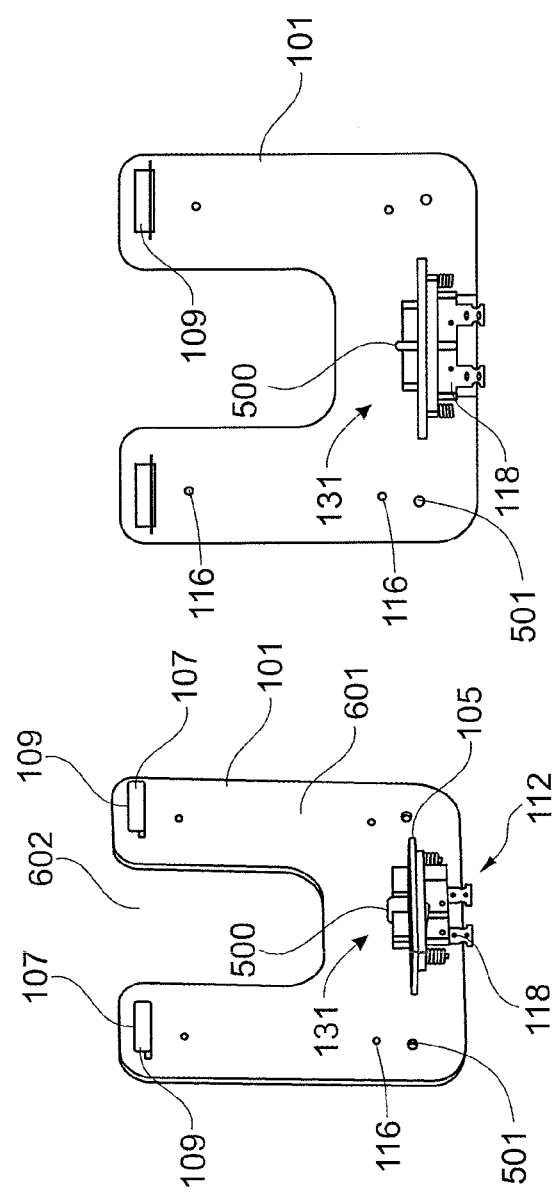

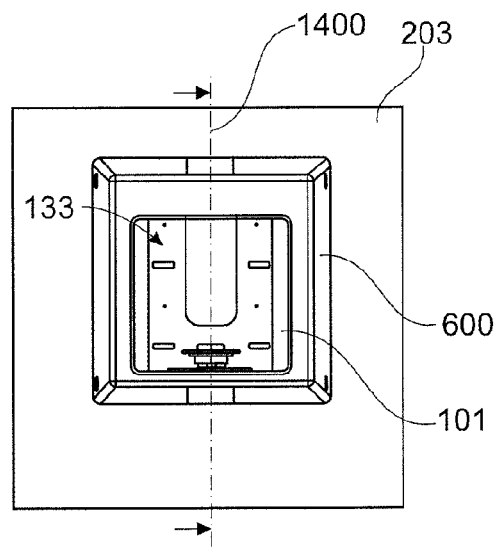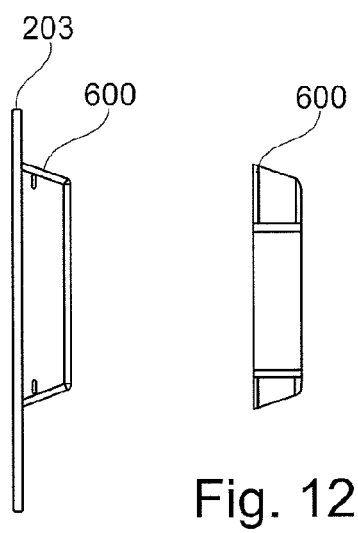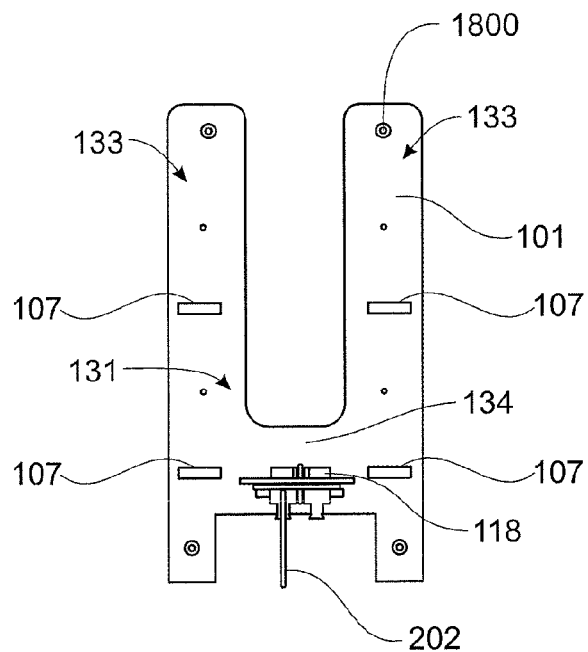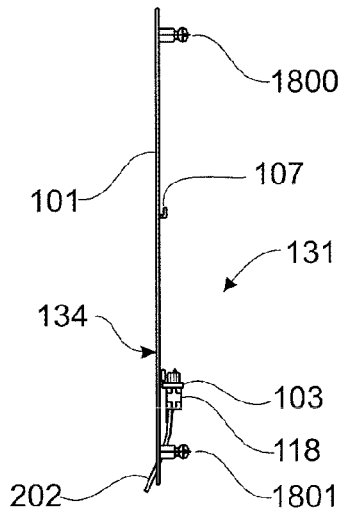
Fig. 10  Fig. 11  Fig. 12  Fig. 13  Fig. 14

DEVICE FOR ELECTRICALLY CONNECTING AND ATTACHING AN ELECTRICAL DEVICE TO A WALL IN A VEHICLE

CROSS-REFERENCE TO RELATED APPLICATIONS

This is a continuation of International Application No. PCT/EP2011/066140, filed Sep. 16, 2011, which claims priority to German Patent Application No. 10 2010 045 590.3, filed Sep. 16, 2010 and to U.S. Provisional Patent Application No. 61/383,449, filed Sep. 16, 2010, the disclosure of which applications are each incorporated herein by reference in their entirety.

TECHNICAL FIELD

The technical field relates to an apparatus for electrically connecting and attaching an electrical device to a wall in a vehicle, to a method for electrically connecting and attaching an electrical device, to a device system and to a vehicle.

BACKGROUND

For reasons relating to weight, walls in vehicles and in particular in aircraft frequently comprise composite materials which, for example, comprise a honeycomb core that is enclosed by covering layers. In such a material it is not possible to arbitrarily affix screw connections; instead, already at the time of manufacturing, threaded bushes are integrated at specifically predetermined positions. In this manner, while additions such as electrical equipment can be safely attached to a wall in a vehicle, nevertheless exchanging the electrical device at a later stage for another electrical device with a different attachment hole pattern that does not correspond to the already existing threaded bushes is difficult.

Initial installation or exchange of an electrical device in the case of maintenance is, furthermore, extremely involved because at the time of installation of the equipment, apart from mechanical connections it is also necessary to establish and secure electrical connections. For example, to this effect on or in the wall one or several connecting cables or the like are provided, which need to be reliably connected to corresponding plugs or sockets of the electrical device.

DE 60 2004 012 938 T2 describes a storage unit with rails for guiding electrical equipment in aircraft. WO 00/38951 describes a display installed on a mounting device in the ceiling region of an aircraft. DE 10 2006 023 047 A1 describes a modular galley in which electrical equipment can be integrated that is electrically connected by way of corresponding interfaces.

In addition, other objects, desirable features and characteristics will become apparent from the subsequent summary and detailed description, and the appended claims, taken in conjunction with the accompanying drawings and this background.

SUMMARY

Accordingly, it may be desirable to provide an improved apparatus for electrically connecting and attaching an electrical device to a wall in a vehicle. It may also be desirable to state an improved method for electrically connecting and attaching an electrical device to a wall.

An apparatus according to the present disclosure for electrically connecting and attaching an electrical device to a wall in a vehicle comprises a universal base plate with a first connection region with a first electrical connector positioned therein, and a universal rear wall with a second connection region with a second electrical connector positioned therein. The base plate comprises attachment means for attaching the base plate to a wall in a vehicle. The rear wall is designed to form part of an electrical device or to be attached thereto. The rear wall and the base plate comprise largely corresponding directions of extension and are designed to be brought into mechanical engagement with each other. During mechanical engagement the first connection region and the second connection region are arranged adjacent to each other in such a manner that the first electrical connector and the second electrical connector establish a mutual electrical connection.

In the context of the present disclosure the term "electrical connection" means that a supply line provided on or in the wall establishes a connection to the electrical device to be attached. In this arrangement supply lines could not only provide a supply voltage, but also implement a connection to a databus, to a network or to some similar communication infrastructure. Electrically connecting thus comprises at least connection to a supply voltage; in the case of modern electrical devices also connecting to a communication infrastructure. Electrically connecting requires at least two electrical connectors that provide an interface to a supply line provided on or in the wall, and to the electrical device. By connecting the two electrical connectors the electrical device is connected to the supply line. Supply lines and a first electrical connector connected to them can also be of a universal nature and at the same time can make it possible to provide a voltage supply and to implement data transmission. In contrast to this, the electrical connectors can be implemented in various ways, as will be explained further below in some exemplary embodiments.

The electrical connectors can be designed as a combination of mechanical-electrical connectors, for example a socket and a matching plug which can, for example, conform to the standard EN 4165. As an alternative it is also possible to use non-contacting electrical connector systems that are implemented by means of coil pairings that form transmitters. Such systems comprise at least one primary coil and one secondary coil which are made to align as tightly as possible and which by way of induction of voltages in one direction can provide a supply voltage, and by transmitting a higher-frequency electromagnetic signal can also transmit data in one or two directions. The primary coil could, for example, be arranged on the base plate and could be considered to be the first electrical connector, while the secondary coil could be arranged on the rear wall, thus forming the second electrical connector. Such a system is, for example, shown in DE 10 2008 024 217 A1.

The terms "first connection region" and "second connection region" refer to the region of the base plate and of the rear wall in which region the first electrical connector and the second electrical connector are arranged. When dimensioning the base plate and the rear wall it must be ensured that the connection regions are designed and positioned in such a manner that when there is complete engagement of the rear wall and of the base plate a safe, permanent and reliable electrical connection between the first electrical connector and the second electrical connector is achieved. This can be ensured in that the electrical connectors can be attached in the connection regions in such a manner that contact openings or contact surfaces of the connectors, which contact openings or contact surfaces are responsible for establishing an electrical connection, during complete engagement of the rear wall and the base plate are directly situated on top of each other or plunge into each other by a predetermined distance.

The universal base plate thus forms a universal carrier for a host of different electrical devices to be used in a vehicle, on a wall. Universality is achieved in that the electrical device and the wall to which the electrical device is to be attached are connected to matching components in the form of the rear wall and the base plate. There is then no longer any need to provide new attachment holes with some other attachment hole pattern in the wall. The base plate can be installed to threaded bushes or similar receiving devices firmly integrated in the wall, while attachment of the electrical device always takes place on the base plate.

As a result of the mechanical engagement of the rear wall in the base plate, which engagement is shown in more detail in the various embodiments shown below, it is furthermore possible to do without conventional attachment methods with a multitude of screw connections arranged on the rear wall. With a suitable design of the base plate and the rear wall, mechanical engagement can be achieved significantly more quickly than is the case with the preparation of screw connections. Because of mechanical engagement, which can result in a positive-locking or non-positive-locking connection, the electrical device is mounted in a mechanically reliable manner, wherein the effort required for attaching or exchanging the electrical device is considerably reduced.

The wall can be any surface in any space of a vehicle; this can include lateral linings, partition walls, walls of monuments, if applicable also doors or other movable planar elements. Using the example of an aircraft, it is thus not mandatory for the wall to be arranged in a passenger cabin; it can also be part of a cockpit or of a cargo compartment. In principle, all the wall types have one feature in common in that on or in them one or several supply lines are provided that are connected to a further system of the vehicle.

Apart from the universal usability of such a combination comprising a base plate and a rear wall, there is generally an advantage in that the electrical connection of the electrical device is particularly simple to establish. Merely as a result of the engagement between the rear wall and the base plate the first electrical connector and the second electrical connector interconnect so that significant labour savings can be achieved. It is no longer necessary to manually connect supply lines with the electrical device by connecting a loosely hanging plug and a socket that is difficult to get to; mechanically securing this connection and stowing the piece of line comprising the plug and socket no longer need to be carried out.

Overall, as a result of the apparatus according to the present disclosure, the time required for installing the electrical device on the wall, or exchanging the aforesaid, is significantly reduced, while no additional expenditure for producing an electrical connection is required. In particular in the manufacture of an aircraft, time spent on integrating or fitting in a cabin can be reduced, because as a result of the option of prefabricating the electrical device and the wall, which for example forms part of a monument in the cabin, attachment and electrical connection can be significantly accelerated.

In one exemplary embodiment of the present disclosure, the universal rear wall forms part of the electrical device. In particular for weight-saving integration of the electrical device in a vehicle this exemplary embodiment provides significant advantages because installing a universal rear wall on an electrical device is no longer necessary as a result of replacement, in some sections or entirely, of a rear wall by the universal rear wall according to the present disclosure. Installing the electrical device on the wall thus also obviates the need for the step of installing the rear wall to the electrical device, and the connection between the electrical device and the wall comprises the highest possible degree of prefabrication. It is thus possible, within the context of the manufacturing process of an aircraft, to reduce the installation time, because the electrical device and the wall can already be completely prefabricated, and installation personnel can more quickly move on to complete further work.

In one exemplary embodiment the base plate in the first connection region comprises a first recess in which the first electrical connector is arranged, while the rear wall in the second connection region comprises a second recess in which the second electrical connector is arranged. In each case the recesses provide a precise installation location for the electrical connectors so that precise positioning of the electrical connectors in an engagement position of the base plate and of the rear wall relative to each other is determined by the dimensioning and positioning of the recesses, thus influencing the success of the electrical connection.

In one exemplary embodiment the first recess and the second recess are in each case arranged in a first flange and in a second flange that extend at an angle from the base plate and the rear wall. The angle is generally about 90°. The direction of action of the two electrical connectors is thus selected in such a manner that, for example by movement, parallel to the extension, of the rear wall on the base plate, the contact surfaces or contact openings are moved towards each other and in this manner the electrical contact can be established. In their end positions, i.e. when the rear wall and the base plate are in engagement, the flanges extend spaced apart from each other and parallel to each other when the electrical contact has been established.

In one exemplary embodiment of the present disclosure the base plate comprises an opening adjacent to the first connection region. In this manner a connecting cable can be routed directly from the wall through the opening to the first electrical connector in the recess of said connector. In this manner the base plate can be attached to the wall already before the first electrical connector is connected to the base plate.

In one exemplary embodiment of the present disclosure the rear wall comprises an opening adjacent to the second connection region, which opening makes it possible to route an electrical connecting cable to the active components of the electrical connector. Removal of an electrical connector in or on a wall during removal of the electrical device can be avoided in this manner, because the first electrical connector and the second electrical connector are very easily accessible through the corresponding openings.

In one exemplary embodiment the base plate comprises at least one first engagement means, and the rear wall comprises at least one second engagement means that is designed so as to correspond to the first engagement means, which engagement means are designed to engage each other mechanically. Engagement of the one engagement means with the other engagement means results in a mechanical non-positive-locking and/or positive-locking connection, wherein the two engagement means are designed to engage each other, become jammed to each other, hook into each other or enclose each other.

In one exemplary embodiment of the present disclosure one of the first and second engagement means is an attachment hook, while the respective other engagement means is a corresponding hook recess into which the attachment hook can be inserted. Generally, the attachment hooks are arranged on the universal base plate, while the corresponding hook recesses are arranged in the rear wall of the electrical device. In the alternative case the base plate would have to provide corresponding spacing between the hook recesses arranged on it and the wall so that the attachment hooks can be fed through the hook recesses without any problems. Guiding the attachment hooks in attachment apertures and subsequently moving the rear wall substantially parallel to the extension of the base plate causes engagement between the rear wall and the base plate, i.e. between attachment hooks and hook recesses. Generally, in this arrangement the attachment hooks extend largely parallel to the direction of extension of the base plate; however, they are spaced apart from it in such a manner that they can be brought through the hook recesses. The attachment hooks are generally sufficiently flat so that they do not overly contribute to the thickness of the electrical device. In one example, the attachment hooks are no more than about 6 mm in depth.

The use of attachment hooks and hook recesses results in two-stage attachment in which the rear wall or the electrical device arranged on said rear wall is moved to the base plate so that the attachment hooks enter the hook recesses. By subsequent movement in a direction offset by about 90° the attachment hooks are slid into the hook recesses up to the end stop. In the case of a base plate attached to a vertical wall the first movement step generally comprises a horizontal movement, while the second movement step generally comprises a vertical movement. Because of gravity generally the openings of the attachment hooks face against the direction of gravity.

In one exemplary embodiment the attachment hook is designed as a positioning attachment hook that extends in a planar manner at a predetermined space to its attachment surface and comprises a shape that tapers off at least in some regions. The tapering shape facilitates insertion of the attachment hooks into the hook openings. As a result of continuous insertion of the attachment hooks into the hook recesses the attachment hooks take up increasing width of the hook recesses so that they get displaced relative to the hook recesses in such a manner that they are finally aligned in the predetermined engagement position so as to be exactly flush with the hook recesses.

In one exemplary embodiment the attachment hook and/or the hook recesses are equipped with at least one latching means adapted for creating a latching or snap-on connection. E.g. the latching means may include a protrusion in one region of the attachment hooks that is positioned such that it extends into a latching recess near the hook recesses. When the rear wall reaches the engagement position the latching means generally snap into each other. There may be at least two further options. The latching or snap-on connection may be designed as a self-locking connection or a loosely supporting connection that is easily detachable. Further, the position of one or more latching means for a latching or snap-on connection may be anywhere on the rear wall or the base plate or on both parts in a correlating arrangement.

In one exemplary embodiment of the present disclosure the base plate comprises at least one first tensioning means that corresponds to a second tensioning means on the rear wall in such a manner that during engagement of the base plate and the rear wall tensioning between the base plate and the rear wall by way of the first tensioning means and the second tensioning means can be produced. In one example, the tensioning means can be implemented as screw apertures that make it possible to receive screws or the like.

Generally, the first and the second tensioning means are designed as screw apertures in the first flange and in the second flange that are spaced apart from each other during engagement of the base plate and the rear wall. The spacing could, for example, be between about 0.2 and about 1 mm and in one example, about 0.5 mm. By installing a screw connection and tightening it, the rear wall is tautly pulled to the base plate, attachment of the rear wall to the base plate is significantly improved, and the danger of rattling is eliminated. For the above to occur it may be desirable that the material or materials used in the rear wall and the base plate are elastic to some extent so that the tensioning means snugly fit to each other when tensioned.

In one exemplary embodiment of the present disclosure the first electrical connector or the second electrical connector is held in a floating bearing arrangement. In this context the term "floating bearing arrangement" refers to an attachment of the first electrical connector with a certain movement tolerance that is sufficient, in the case of installation inaccuracies or manufacturing tolerances, to cause a compensatory movement between the first electrical connector and the second electrical connector. Such a floating bearing arrangement can, for example, be achieved by spring elements that are arranged between the first electrical connector and its attachment means so that if adequate force acts on the first electrical connector the spring elements are compressed and render the electrical connector slidable in its seat. As a result of the floating bearing arrangement it is possible to prevent situations in which during attachment of the electrical device to the base plate connecting errors or tilting occur between the first electrical connector and the second electrical connector.

In one exemplary embodiment the rear wall comprises a first guide element, and the base plate comprises a second guide element that has been shaped so as to correspond to the first guide element, wherein the first guide element and the second guide element are designed to provide guidance to a movement parallel to the extension of the rear wall on the base plate in order to prevent the occurrence of any offset between the first electrical connector and the second electrical connector. These connectors can thus be brought more accurately into alignment so that a reliable electrical connection can be ensured. The base plate could, for example, comprise first guide elements designed as guide bodies, while the rear wall comprises second guide elements that are designed as delimitation edges of a recess. The recess can comprise a shape that opens up towards the outside, as a result of which shape the delimitation edges comprise spacing towards each other that diminishes towards the interior of the rear wall so that automatic centring or positioning takes place when the rear wall is slid onto the base plate.

In one exemplary embodiment the apparatus comprises a spacer that is attachable to the base plate or to the rear wall. The spacer is designed to set a minimum distance between the rear wall and the base plate so that rattling noises can be prevented and, for example, heat dissipation between the base plate and the rear wall is possible. The achievable or necessary minimum distance is dictated by the selection of the material used for the base plate and for the rear wall.

The present disclosure furthermore relates to a method for attaching an electrical device to a wall in a vehicle. As has been shown in the previous description, the method can comprise the provision of a wall with a universal base plate attached thereto in a vehicle, wherein a first electrical connector is attached to the base plate in a first connection region, the provision of an electrical device with a universal rear wall arranged thereon, wherein a second electrical connector is attached to the rear wall in a second connection region, and the establishment of mechanical engagement between the base plate and the rear wall in such a manner that the first connection region and the second connection region are made to become aligned and that an electrical connection is established between the first electrical connector and the second electrical connector.

In general, it may be advantageous to bring about engagement between the base plate and the rear wall and to bring about the electrical connection between the first electrical connector and the second electrical connector by means of a guided movement parallel to the extension of the electrical device, or the rear wall arranged thereon, along the base plate, after the rear wall and the base plate have been correspondingly positioned relative to each other. Guided movement can be achieved by means of guide elements in order to prevent lateral offset between the first electrical connector and the second electrical connector.

As outlined above, one exemplary embodiment of the method according to the present disclosure can involve hooking at least one hook recess of the rear wall to at least one attachment hook of the base plate, and of sliding the rear wall of the electrical device onto the base plate. In this arrangement where the wall is situated in the vehicle, sliding-on can also be supported by gravitational forces so that movement parallel to the extension of the rear wall with the electrical device situated thereon generally extends in vertical direction on the wall. In this arrangement, hooking-in generally takes place in a direction substantially perpendicular to the plane of extension of the base plate; in the case of the installed wall thus substantially in horizontal direction, after which the substantially vertical sliding-on follows.

Finally, the electrical device slid onto the base plate can be affixed or tensioned, and thus mechanical engagement can be achieved, by means of a screw connection between the rear wall and the base plate. In this arrangement the screw connection can be made between a first tensioning means in the base plate and a second tensioning means in the rear wall. The tensioning means can be screw apertures that are arranged in a flange that extends at an angle from the base plate, or that are arranged directly in the base plate. An additional panel or frame or covering frame for covering the region between the wall and the electrical device can furthermore be utilized.

The method according to the present disclosure can, furthermore, involve clicking-in a frame or a panel to the base plate by means of a spring-loaded snap lock. As an alternative to a screw connection, for example by means of the spring-loaded snap lock, it can be ensured that the electrical device by its rear wall is affixed to the base plate in all three spatial directions.

The present disclosure furthermore relates to an equipment system comprising a wall, a device described above and below, and an electrical device. In this arrangement the base plate of the device is attached to the wall, and the rear wall of the device is part of the electrical device or is attached to the electrical device.

In one exemplary embodiment the electrical device is a stationary electrical device with a user interface to input and output information and data. In particular in modern aircraft usually there are a host of on-board systems which during operation of the vehicle need to be regularly controlled or influenced in their operation. For example, these systems comprise an air conditioning system, an illumination system and an on-board entertainment system. These systems are of such high complexity that they frequently need control units comprising dedicated user interfaces of their own. Examples of this can include a flight attendant panel, FAP, or a remote control computer, RCC. In this arrangement the electrical device is arranged so as to be stationary; it can, for example, make it possible for vehicle attendants to control on-board systems. For simple installation of the electrical device the device according to the present disclosure is used, wherein in this case both a power supply and a connection with a data interface is established.

The present disclosure further relates to a vehicle comprising at least one space, and a wall situated therein, as well as an electrical device and a device according to the present disclosure. The vehicle can, in one example, be an aircraft or an aeroplane because with these to a large extent fitting-out work is required that with conventional installation of electrical devices on walls could be blocked or delayed.

A person skilled in the art can gather other characteristics and advantages of the disclosure from the following description of exemplary embodiments that refers to the attached drawings, wherein the described exemplary embodiments should not be interpreted in a restrictive sense.

BRIEF DESCRIPTION OF THE DRAWINGS

The various embodiments will hereinafter be described in conjunction with the following drawing figures, wherein like numerals denote like elements, and wherein:

FIGS. 6 to 9 show diagrammatic perspective views of a base plate according to an exemplary embodiment of the present disclosure.

FIGS. 10 to 12 show diagrammatic perspective views of a base plate with the frame according to an exemplary embodiment of the present disclosure.

FIG. 13 and FIG. 14 show diagrammatic perspective views of a base plate according to an exemplary embodiment of the present disclosure.

DETAILED DESCRIPTION

The following detailed description is merely exemplary in nature and is not intended to limit the present disclosure or the application and uses of the present disclosure. Furthermore, there is no intention to be bound by any theory presented in the preceding background or the following detailed description.

Figure 1A:
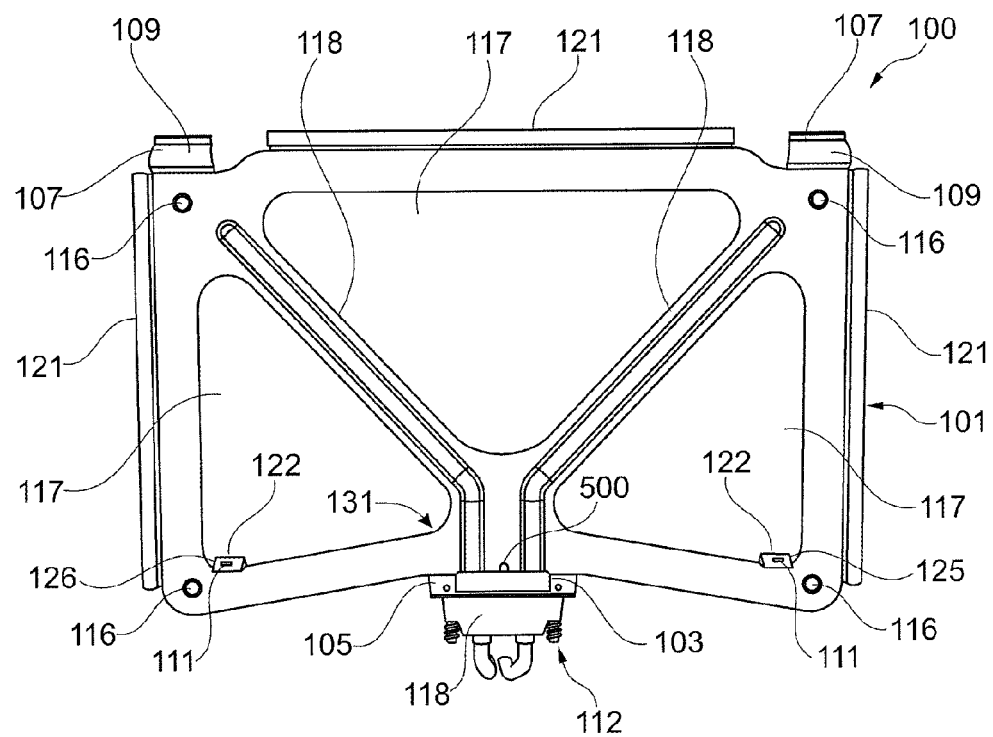
FIG. 1A, FIG. 1B and FIG. 2 show diagrammatic perspective views of the apparatus according to an exemplary embodiment of the present disclosure.
Figure 1B:
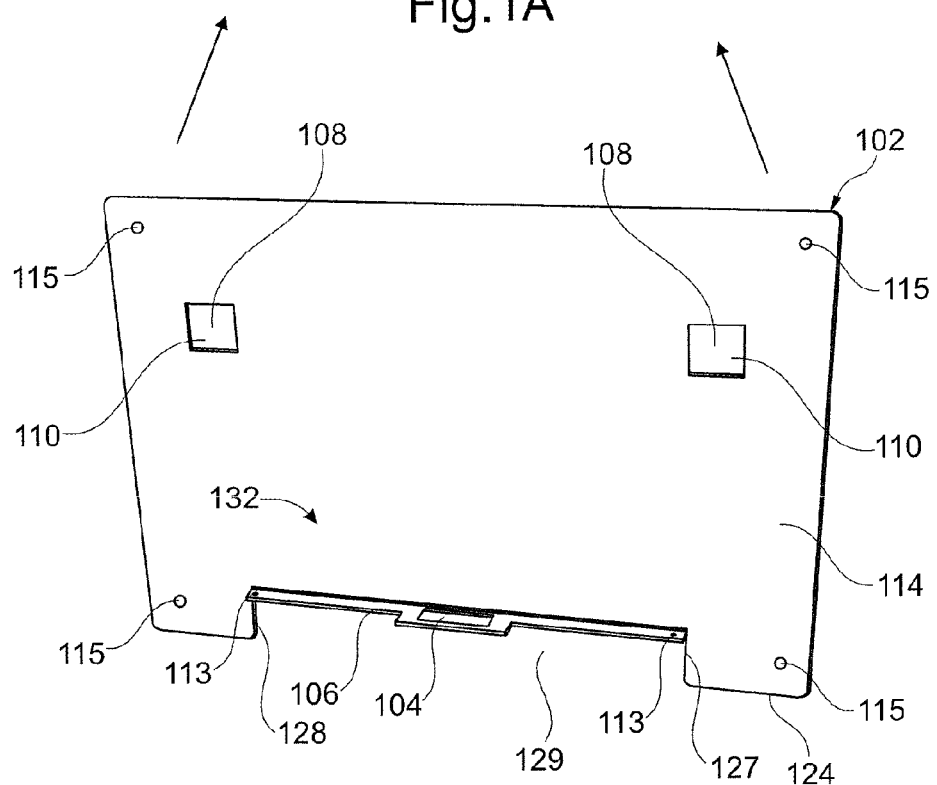

FIG. 1A and FIG. 1B show a universal base plate 101 and a universal rear wall 102 which together form two components of a device 100 for attaching an electrical device to a wall in a vehicle. In each case the base plate 101 and the rear wall 102 comprise a substantially planar extension which allows simple attachment to the wall and simple attachment to the electrical device or integration in the electrical device. The base plate 101 comprises attachment means in the form of screw apertures 116 for attachment of the base plate 101 to the wall, while the rear wall 102 comprises screw apertures 115 for attachment to the electrical device. These could be replaced by other attachment means or could be entirely unnecessary if complete integration in the electrical device is carried out.

In order to bring about engagement the base plate 101 comprises first engagement means 107 in the form of attachment hooks 109, spaced apart from each other, whose positions correspond to those of second engagement means 108 in the form of hook openings 110, spaced apart from each other, in the rear wall 102. On a side of the base plate 101, which side faces away from the attachment hooks 109, the base plate 101 in a section designated the first connection region 131 of the base plate 101 a first electrical connector 118 is arranged in a first recess 103. A second electrical connector 119 (see FIG. 2 below) arranged in a second recess 104 of a second connection region 132 of the rear wall 102 can establish an electrical connection with said first electrical connector 118. In this arrangement the second connection region 132 is formed on a side of the rear wall 102, which side faces away from the hook openings 110.

The planar extension of the base plate 101 and of the rear wall 102 facilitates hanging-in the rear wall 102 by its hook recesses 110 to the attachment hooks 109 and subsequent sliding of the rear wall 102 parallel to the direction of extension of the base plate 101 downwards in the drawing plane, so as to, at the same time, establish mechanical engagement between the rear wall 102 and the base plate 101, as well as an electrical connection between the first electrical connector 118 and the second electrical connector 119. It is the overall object of the device 100 according to the present disclosure to be able at the same time to establish as fast as possible a mechanical connection of an electrical device with a wall of an aircraft, as well as an easy electrical connection of an electrical device with one or several supply lines (not shown in FIG. 1A and FIG. 1B), which supply lines are connected to the first electrical connector 118.

To ensure that the positions of the first and of the second electrical connectors 118, 119 are flush during mutual engagement of the rear wall 102 and the base plate 101, the recesses 103 and 104 are, for example, in each case arranged in a first flange 105, which extends substantially perpendicularly from the base plate 101, and in a second flange 106, which extends substantially perpendicularly from the rear wall 102, which flanges in the engagement position are aligned so as to be parallel to each other and generally also comprise a predefined spacing from each other, which spacing is predetermined for reliable connection of the first electrical connector 118 and of the second electrical connector 119.

In the exemplary embodiment shown, the first electrical connector 118 is a socket and the second electrical connector 119 is a plug, designed so as to correspond to the socket. It is understood that it is also possible for the base plate 101 to comprise a plug, while on the rear wall 102 a socket that corresponds to it is arranged. It may suggest itself to select the plug and the socket from the standard EN 4165 or to design them based on this standard. In a manner that is different from the above, it may also suggest itself, instead of providing mechanical-electrical connections, to provide a wireless connection which is implemented by means of coil pairings that form transmitters, in which coil pairings a primary coil is provided on the base plate as a first electrical connector 118, and a secondary coil is provided as a second electrical connector 119 on the rear wall.

Thus in a single manipulation the electrical device, on which the rear wall 102 is arranged, can be attached to the wall to which the base plate 101 is arranged. At the same time the electrical device is electrically connected to other systems on board the vehicle by establishing the electrical connection between the two electrical connectors 118 and 119. For example during installation or maintenance this speeds up fitting out the vehicle or the process of exchange.

The rear wall 102 comprises an opening 129 that makes it possible to route a connecting cable through to the first electrical connector 103 without this requiring deinstallation of the base plate 101 and/or of the rear wall 102. Aligning the rear wall 102 to the base plate 101 is facilitated by lateral delimitation edges 127 and 128 of the opening 129, which are guided by outer edges 125 and 126 of guide bodies 122 connected to the base plate 101. The guide bodies 122 can equally be integrated as separate components or as guide flanges integrated in the base plate 101, which guide flanges can be made by means of one or several folds or folded edges.

Furthermore, it may be advantageous if the recess 129 also widens towards the outside so that with increasing distance from the second flange 106 or from the second connection region 132 the distance between the delimitation edges 127 and 128 increases. When the rear wall 102 is slid onto the base plate 101, as a result of the diminishing distance between the delimitation edges 127 and 128 as the slide-on movement progresses, automatic centring or positioning of the two electrical connectors 118 and 119 relative to each other takes place.

In order to compensate for manufacturing tolerances or imprecise movement, despite the proposed guide arrangement, of the first electrical connector 118 relative to the second electrical connector 119, the first electrical connector 118, or as an alternative the second electrical connector 119, is generally held in a floating bearing arrangement. In this context the notion of a floating bearing arrangement relates to a bearing arrangement or mounting arrangement that to some extent is movable. The ability to move can be implemented in that a screw connection 112 between the base plate 101 and the first electrical connector 118 or between the rear wall 102 and the second electrical connector 119 is not completely tightened, but instead includes spring elements or other elastic devices between the screwing means used and the respective connector 118, 119, which devices make it possible, if adequate forces act on them, for the first electrical connector 118 or 119 to move in the recess 103 or 104.

In order to further improve guidance of the first electrical connector 118 and of the second electrical connector 119 relative to each other a centring pin 500 can be used which as an example is shown on the first electrical connector 118. The latter is generally arranged in the centre of the electrical connector 118 and when the second electrical connector 119 moves towards the first electrical connector 118 engages the first electrical connector 118 by way of a corresponding, generally funnel-shaped, opening of the second electrical connector 119. As a result of the gradually diminishing diameter of this funnel-shaped opening with progressive movement of the second electrical connector 119 towards the first electrical connector 118, centring of the two electrical connectors 118 and 119 relative to each other takes place.

In order to save weight, the base plate 101 can, to some extent, be skeletonised, i.e. it can comprise one or several recesses 117, without this compromising the respective mechanical integrity of the base plate or of the rear wall. In the exemplary embodiment shown, as a result of the recesses free-standing webs 118 are formed which take up the mechanical loads acting on the base plate. Depending on the selection of the material and the selection of the material thickness, more or less pronounced skeletonisation can be carried out.

In order to adjust the required space between the base plate 101 and the rear wall 102 the base plate 101 comprises spacers 121 which are designed as lateral flanges of a defined height. In this manner it is possible to largely prevent rattling noises between the rear wall 102 and the base plate. In order to attach or tension the rear wall 102 to the base plate the rear wall in its second flange 106 comprises screw apertures 113 through which the screwing means can be screwed into screw receiving devices 111 on the guide bodies 122. If there is a particular distance between the second flange 106 and the guide bodies 122 in the engagement position, tensioning can take place by screwing the rear wall 102 to the base plate 101, which tensioning further reduces or entirely eliminates rattling sounds and considerably improves the quality of the connection between the rear wall 102 and the base plate 101. The screw apertures 111 and 113 can thus also be referred to as tensioning means.

Figure 2:
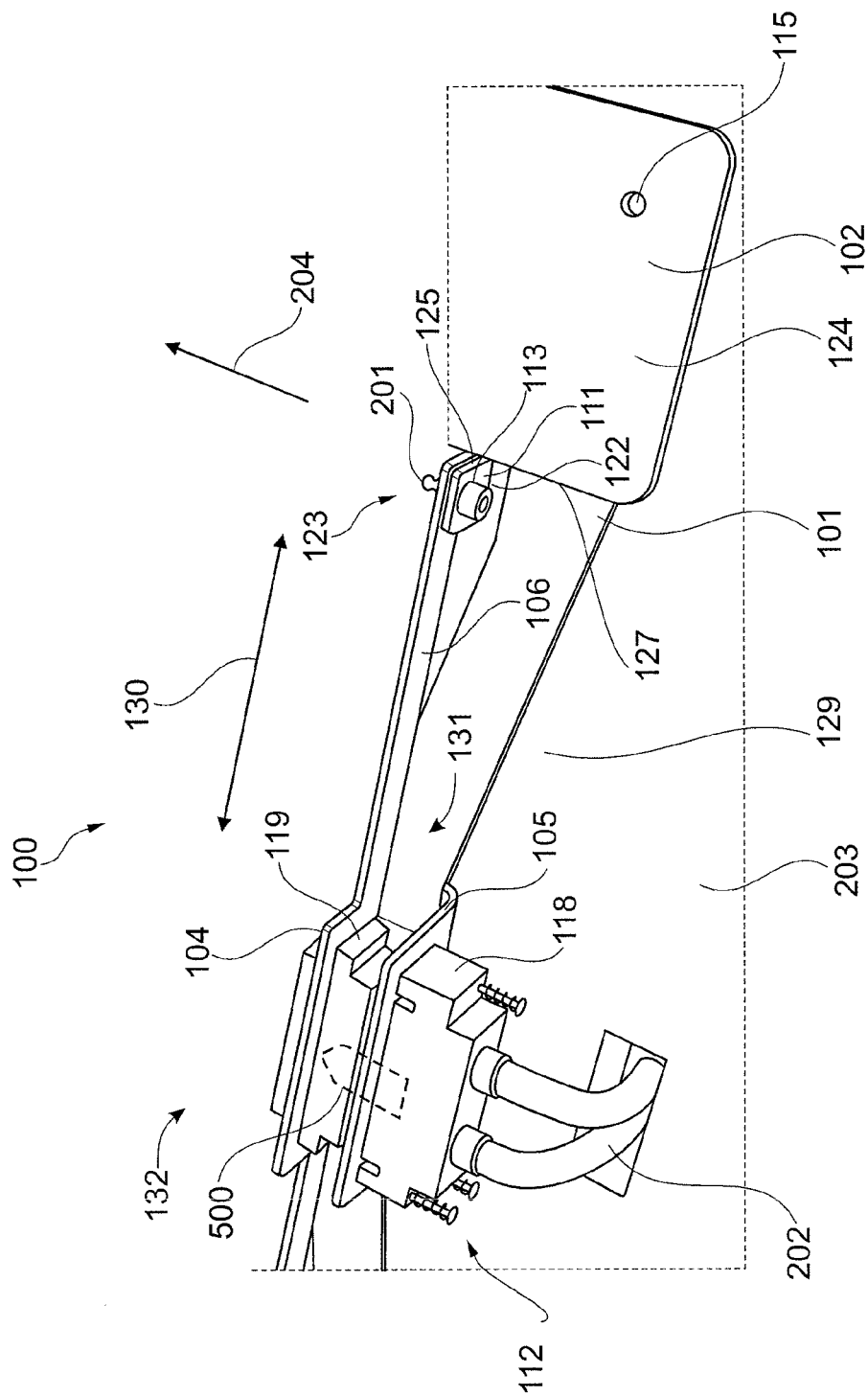

FIG. 2 shows a small section of the bottom of the device 100 according to the present disclosure in which the first electrical connector 118, designed as a socket, and the second electrical connector 119, designed as a plug, are interconnected, and the base plate 101 and the rear wall are in engagement. In this arrangement the base plate 101 is attached to a wall 203 in a vehicle, which wall 203 comprises an opening 202 for feeding connecting cables through to the first electrical connector 118, which by means of the floating screw connection 112 is held on the recess 103 of the first flange 105. By means of the centring pin 500 the first electrical connector 118 is ideally aligned with the second electrical connector 119, which has been screwed into the recess 104 of the second flange 106.

In order to secure engagement, the rear wall 102 is screwed to the screw receiving device 111 of the guide body 122 with the use of a screwing means 201 by way of the screw aperture 113. A guide 123 is formed in that the delimitation edge 127 of the opening 129 of the rear wall 102 rests flush against the outer edge 125 of the guide body 122. This prevents transverse movement 130 from a centred engagement position and thus lateral offset.

FIGS. 3A-3D in a total of four section figures 301 (FIG. 3A), 302 (FIG. 3B), 303 (FIG. 3C) and 304 (FIG. 3D) show somewhat more clearly the process of connecting the rear wall 102 to the base plate 101. In this illustration an electrical device 200 is shown in a dashed line, which electrical device 200 can generally already prior to the attachment process have been connected to the wall 203 within the vehicle fuselage with the rear wall 102. The wall 203 could, for example, be a wall of a monument in an aircraft cabin. At the same time the base plate 101 can generally already be arranged on the wall 203, and connecting lines project through the opening 202 to the first electrical connector 118. Attaching the base plate 101 to the wall 203 and integrating or attaching the rear wall 102 to the electrical device 200 can generally be carried out by the manufacturer or supplier of the wall 203 and of the electrical device 200. As a result of the apparatus 100 according to the present disclosure the actual integration of the electrical device 200 requires only a few manipulations.

Figure 3:
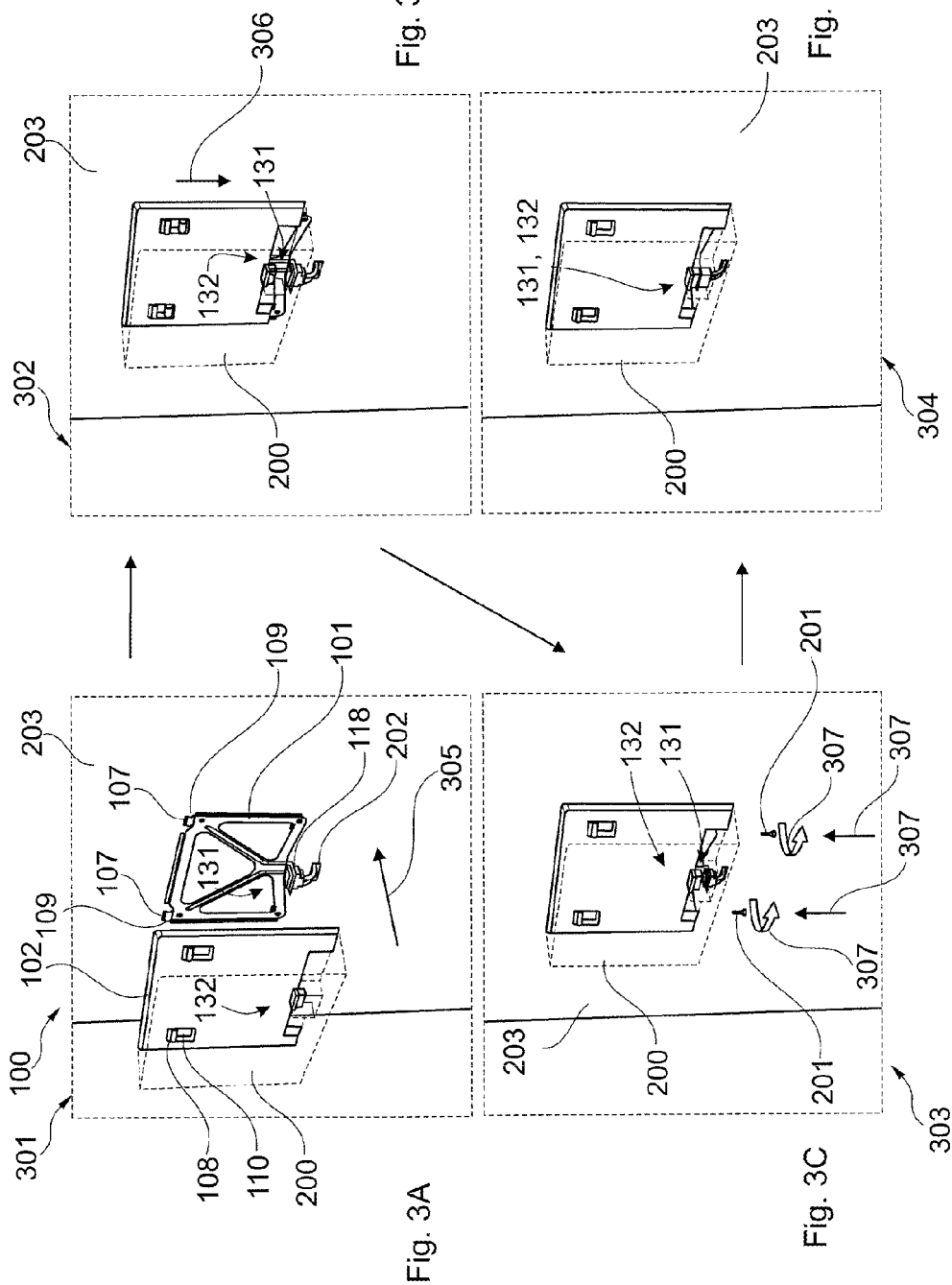
FIGS. 3A-3D show a diagrammatic perspective view of an attachment process according to an exemplary embodiment of the present disclosure.

First the electrical device 200 with the rear wall 102 arranged thereon is moved in a direction 305 towards the base plate 101 so that the hook recesses 110 are flush with the attachment hooks 109 (section figures 301; FIG. 3A). The first connection region 131 of the base plate 101 and the second connection region 132 of the rear wall 102 are still spaced apart to such an extent that the electrical connectors 118 and 119 do not establish a connection. As soon as the rear wall 102, having been mounted, rests against the base plate 101, and the attachment hooks 109 fully project through the hook recesses 110, the rear wall 102 can be moved parallel to the direction of extension of the base plate 101 in the drawing plane by sliding-on downwards in a direction 306 (section FIG. 302; FIG. 3B). The second connection region 132 approaches the first connection region 131. Consequently the second electrical connector 119 arranged on the rear wall 102 establishes contact with the first electrical connector 118 arranged on the base plate 101, generally guided by the centring pin 500 while carrying out a compensatory movement in the floating bearing arrangement 112, while the rear wall 102 and the base plate 101 engage each other. Subsequently the rear wall 102 can be screwed 307 (section figures 303; FIG. 3C) to the base plate 101 with the use of screwing means 201 as shown in FIG. 2. Section figures 304 (FIG. 3D) shows the completed attachment integration of the electrical device 200 on the wall 203.

Figure 4:
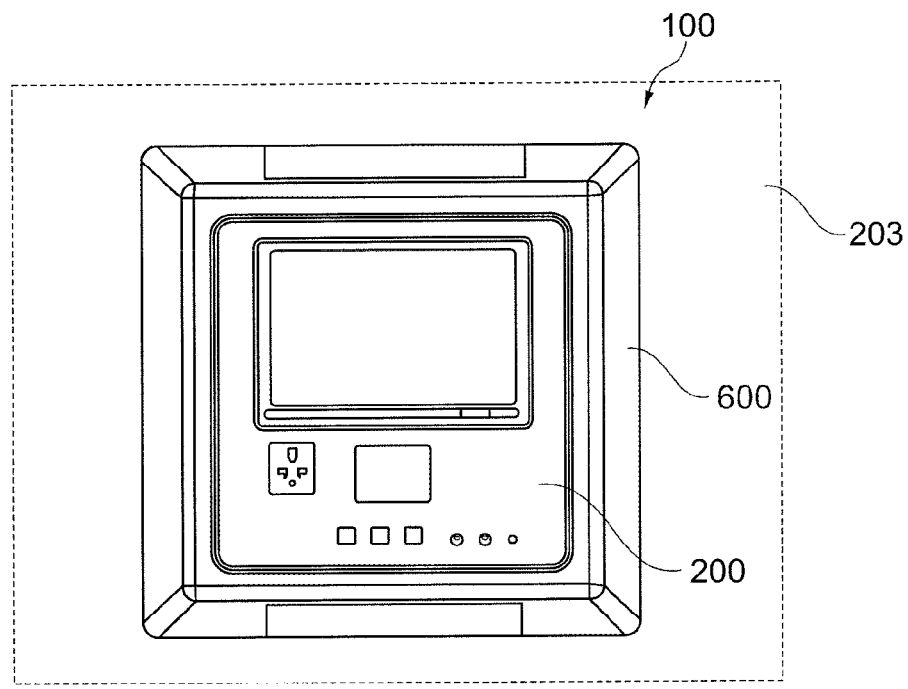
FIG. 4 and FIG. 5 show diagrammatic perspective views of an apparatus or of a base plate according to an exemplary embodiment of the present disclosure.
Figure 5:
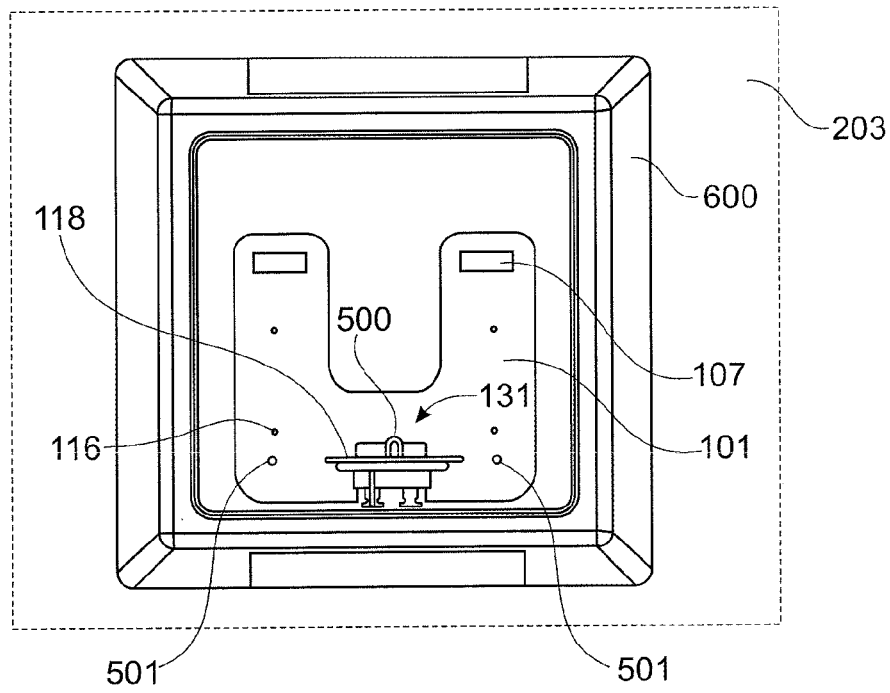

FIGS. 4 and 5 show the manner in which an electrical device 200 attached by means of the apparatus 100 according to the present disclosure could be installed on the wall 203. As an example, the electrical device comprises a display and operating elements that together form a user interface. The electrical device 200 could, for example, be a remote control centre, RCC, for an on-board entertainment system of a vehicle; as an alternative it could be a flight attendant panel, FAP, as an operating element for flight attendants for numerous current consumers and for the air conditioning system in an aircraft cabin, or it could be some other electrical device. While the vehicle is in operation, such an electrical device 200 must be accessible to vehicle attendants, in order to, if required, control particular operations of on-board systems during operation. This requires an electrical connection for providing a supply voltage and for providing a data connection. By means of the apparatus 100 according to the present disclosure the expenditure associated with the manufacture of the vehicle can be reduced and thus the time required for integrating the electrical device 200 can be shortened. As a result of the device according to the present disclosure this electrical device 200 can comprise a universal rear wall 102 already at the time of delivery, which universal rear wall 102 can be installed on a universal base plate 101 which has generally been attached to the wall 203 already during delivery of said wall 203. To cover the space between the electrical device 200 and the apparatus 100 according to the present disclosure a panel 600 can be used that surrounds the electrical device 200 and finishes off flush with the wall 203.

FIG. 5 finally shows the connection between the electrical device and the base plate 203 with the visible side of the electrical device 200 removed. The illustration shows a, for example substantially U-shaped, base plate 101 with a main surface 601, several screw apertures for attachment to the wall 203, and screw apertures 501 for screwing the rear wall 102 of the electrical device 200 from the front. This may be practical in order to be able to install the panel 600 prefabricated to the electrical device 200, which would, however, render screwing together the rear wall 102 and the base plate 101 impossible from the bottom. The base plate 101 further shows two first engagement means 107, spaced apart from each other, which as an example are shown as attachment hooks. As a result of the substantially U-shape of the base plate 101 this is a load-oriented design in which the forces taken up by the first engagement means 107 are fed through the base plate by way of the screw apertures 501 into the wall 203. At the same time the connection region 132 spaced apart from the first engagement means is sufficiently wide to carry out tensioning or locking between the base plate 101 and the rear wall 102 of the electrical device 200.

In FIGS. 6 to 9 the base plate 101 is shown in somewhat greater detail in several views. FIG. 6 shows, for example, a perspective view of the base plate 101 from FIGS. 4 and 5. The base plate 101 is of a substantially U-shaped design, wherein on the ends of the limbs of the substantially U-shape in each case a first engagement means 107 in the form of an attachment hook is arranged. At the opposite end of the base plate 101 the connection region 131 is formed, which comprises a first recess 105 with a first electrical connector 118 arranged therein, wherein the first electrical connector 118 is attached to the base plate 101 by way of a floating screw connection 112. As shown in the figures above, the first electrical connector 118 comprises a centring pin 500 that is arranged in the centre in the first electrical connector 118 and that ensures precise alignment with a second electrical connector 119 (not shown in the illustration). The base plate 101 comprises a main surface 601, which comprises a recess 602 for forming the limbs of the U-shape. Said recess 602 reduces the weight of the base plate 101 so that the apparatus 100 is suitable in particular for installation in an aircraft.

FIG. 8 shows a lateral view of the base plate 101 that shows that the base plate 101 is generally designed in a sheet-like manner. In the drawing plane the attachment hooks 109 open towards the top and are, for example, designed as a folded piece of sheet metal. The latter can, for example, be connected to the base plate 101 by way of a soldered connection or a welded connection. Generally, the base plate 101 should comprise as few individual components as possible, and should, for example, be manufactured from a single piece of sheet metal by means of punching out, deep-drawing or folding. As an alternative to this, the base plate 101 and the rear wall 102 could also be made from a plastic material or a mix of materials.

A top view of the base plate again shows the short distance in the depth direction of the attachment hooks 109, as well as the arrangement of the first electrical connector 118 in a first flange 103 situated in the first connection region 131. As a result of the floating screw connection 112 the first electrical connector 118 can be moved in the flange 103 for the purpose of compensating form tolerances or position tolerances.

FIGS. 10 to 14 show one exemplary embodiment. The base plate 101 shown in FIG. 13 comprises a substantially H-shaped design comprising two limbs 133, spaced apart from each other, with a web 134 formed therein. The first connection region 131 is largely formed by the web 134 because this is where the first electrical connector 118 is located. On the limbs 133 in each case two first engagement means 107 are shown, which in the drawing plane are spaced apart from each other in vertical direction, which engagement means 107 can engage corresponding second engagement means in a rear wall (not shown in detail). In addition, a panel 600 has been provided in order to cover the region between the wall 203 and the electrical device 200.

As shown in FIG. 14, in addition, studs 1800 and 1801 can be provided which together with elastic counterparts in the frame or in the panel 600 form a snap lock. This makes it possible, after attachment of the electrical device 200, to press the frame or the panel 600 by mechanical engagement between the base plate 101 and the rear wall 102 onto the studs 1800 and 1801. This could replace counter-screwing between the base plate and the rear wall.

Figure 15:
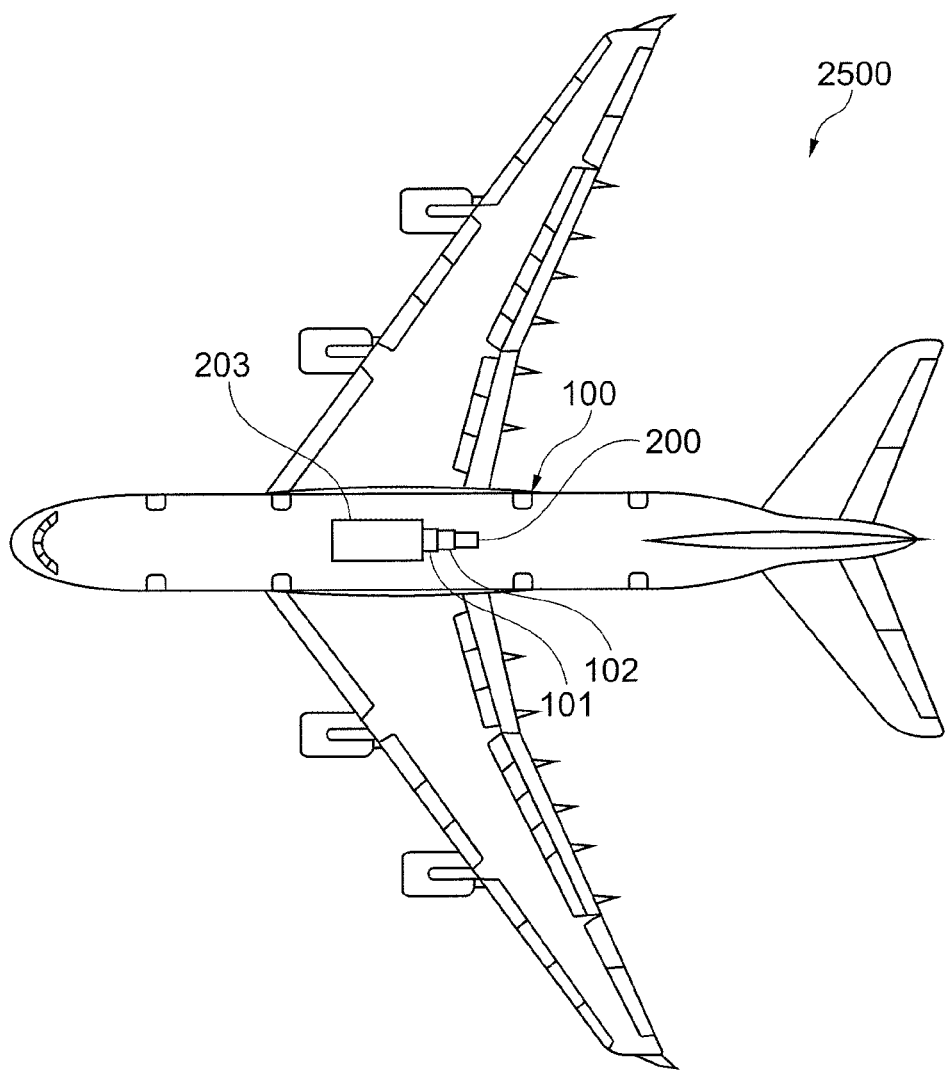
FIG. 15 shows a diagrammatic perspective view of an aircraft according to an exemplary embodiment of the present disclosure.

FIG. 15 shows an aircraft 2500 that comprises a space with a wall 203 arranged therein, to which aircraft by means of an apparatus 100 the electrical device 200 has been mechanically affixed and at the same time electrically connected. The wall 203 is, for example, located on a monument that can, for example, be designed as an on-board toilet, a galley or a stowage cabinet. However, the wall 203 can also be situated in other locations of the space, and can, for example, form sidewalls, partition walls, delimitation walls of cargo compartments and the like.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the present disclosure in any way. Rather, the foregoing detailed description will provide those skilled in the art with a convenient road map for implementing an exemplary embodiment, it being understood that various changes may be made in the function and arrangement of elements described in an exemplary embodiment without departing from the scope of the present disclosure as set forth in the appended claims and their legal equivalents.

What is claimed is:

1. An apparatus for electrically connecting and attaching an electrical device to a wall in a vehicle, comprising:
   a substantially planar universal base plate including a first connection region with a first electrical connector arranged therein and an attachment means for attachment to the wall in a vehicle; and
   a substantially planar universal rear wall including a second connection region with a second electrical connector positioned therein, the universal rear wall designed to form part of the electrical device or to be attached to the electrical device;
   wherein the universal rear wall and the universal base plate comprise largely corresponding directions of extension and are designed to be brought into mechanical engagement with each other, and during mechanical engagement the first connection region and the second connection region are arranged adjacent to each other in such a manner that the first electrical connector and the second electrical connector establish a mutual electrical connection; and
   wherein the universal base plate and the universal rear wall are configured to be mechanically affixed with a force that has a direction parallel to the direction of mechanical engagement;
   wherein the universal base plate in the first connection region comprises a first recess in which the first electrical connector is arranged, and the universal rear wall in the second connection region comprises a second recess in which the second electrical connector is arranged;
   wherein the first recess is arranged in a first flange that extends at an angle from the universal base plate;
   wherein the second recess is arranged in a second flange that extends at an angle from the universal rear wall;
   wherein the universal base plate comprises at least one first engagement means, and the universal rear wall comprises at least one second engagement means that is designed so as to correspond to the first engagement means, wherein the first engagement means and second engagement means are designed to mechanically engage each other; and
   wherein one of the first engagement means and second engagement means is an attachment hook, and the respective other of the first engagement means and second engagement means is a corresponding hook recess into which the attachment hook is insertable.

2. The apparatus according to claim 1, wherein the universal base plate comprises an opening, adjacent to the first connection region, for feeding connecting cables through to the first electrical connector.

3. The apparatus according to claim 1, wherein the universal rear wall comprises an opening, adjacent to the second connection region, for feeding-through connecting cables.

4. The apparatus according to claim 1, wherein the attachment hook is designed as a positioning attachment hook that extends in a planar manner at a predetermined space to its attachment surface and comprises a shape that tapers off at least in some regions.

5. The apparatus according to claim 1, wherein the universal base plate comprises a first tensioning means that corresponds to a second tensioning means on the universal rear wall in such a manner that during engagement of the universal base plate and the universal rear wall the first tensioning means and the second tensioning means create tension between the universal base plate and the universal rear wall.

6. The apparatus according to claim 5, wherein the first tensioning means and the second tensioning means are implemented as screw apertures in a respective one of a first flange that extends at an angle from the universal base plate and a second flange that extends at an angle from the universal rear wall, which are spaced apart from each other during engagement of the universal base plate and the universal rear wall.

7. The apparatus according to claim 1, further comprising a floating bearing arrangement for the first electrical connector or for the second electrical connector.

8. The apparatus according to claim 1, further comprising at least one first guide element on the universal rear wall and a corresponding second guide element on the universal base plate,
wherein the at least one first guide element and second guide element are designed to provide guidance to a movement parallel to the extension of the universal rear wall on the universal base plate in order to prevent the occurrence of any offset between the first electrical connector and the second electrical connector.

9. A method for electrically connecting and attaching an electrical device to a wall in a vehicle, the method comprising:
providing a wall with a substantially planar universal base plate attached thereto in a vehicle, with a first electrical connector attached to the universal base plate in a first connection region;
providing an electrical device with a substantially planar universal rear wall arranged thereon, with a second electrical connector attached to the universal rear wall in a second connection region; and
establishing mechanical engagement between the universal base plate and the universal rear wall in such a manner that the first connection region and the second connection region aligned, an electrical connection is established between the first electrical connector and the second electrical connector; and the universal base plate and the universal rear wall are mechanically affixed together with a force that has a direction parallel to the direction that the mechanical engagement is established;
wherein the universal base plate in the first connection region comprises a first recess in which the first electrical connector is arranged, and the universal rear wall in the second connection region comprises a second recess in which the second electrical connector is arranged;
wherein the first recess is arranged in a first flange that extends at an angle from the universal base plate;
wherein the second recess is arranged in a second flange that extends at an angle from the universal rear wall;
wherein the universal base plate comprises at least one first engagement means, and the universal rear wall comprises at least one second engagement means that is designed so as to correspond to the first engagement means, wherein the first engagement means and second engagement means are designed to mechanically engage each other; and
wherein one of the first engagement means and second engagement means is an attachment hook, and the respective other of the first engagement means and second engagement means is a corresponding hook recess into which the attachment hook is insertable.

10. An equipment system, comprising:
at least one wall;
at least one electrical device; and
at least one apparatus for electrically connecting and attaching the electrical device to the wall, including:
a substantially planar universal base plate having a first connection region with a first electrical connector arranged therein and an attachment means for attachment to the at least one wall; and
a substantially planar universal rear wall including a second connection region with a second electrical connector positioned therein, the universal rear wall designed to be attached to the at least one electrical device,
wherein the universal rear wall and the universal base plate comprise largely corresponding directions of extension and are designed to be brought into mechanical engagement with each other, and during mechanical engagement the first connection region and the second connection region are arranged adjacent to each other in such a manner that the first electrical connector and the second electrical connector establish a mutual electrical connection to couple the at least one electrical device to the at least one wall; and
wherein the universal base plate and the universal rear wall are configured to be mechanically affixed together with a force that has a direction parallel to the direction of mechanical engagement;
wherein the universal base plate in the first connection region comprises a first recess in which the first electrical connector is arranged, and the universal rear wall in the second connection region comprises a second recess in which the second electrical connector is arranged;
wherein the first recess is arranged in a first flange that extends at an angle from the universal base plate; and
wherein the second recess is arranged in a second flange that extends at an angle from the universal rear wall;
wherein the universal base plate comprises at least one first engagement means, and the universal rear wall comprises at least one second engagement means that is designed so as to correspond to the first engagement means, wherein the first engagement means and second engagement means are designed to mechanically engage each other; and
wherein one of the first engagement means and second engagement means is an attachment hook, and the respective other of the first engagement means and second engagement means is a corresponding hook recess into which the attachment hook is insertable.

11. The equipment system according to claim 10, further comprising a floating bearing arrangement for the first electrical connector or for the second electrical connector.

12. A vehicle, comprising:
at least one cabin having at least one wall;
at least one electrical device; and
at least one apparatus for electrically connecting and attaching the electrical device to the wall, including:
a substantially planar universal base plate having a first connection region with a first electrical connector arranged therein and an attachment means for attachment to the at least one wall, the universal base plate including a first guide element; and
a substantially planar universal rear wall including a second connection region with a second electrical connector positioned therein, the universal rear wall designed to form part of the at least one electrical device, the universal rear wall including at least one second guide element that cooperates with the at least one first guide element, wherein the universal rear wall and the universal base plate comprise largely corresponding directions of extension and are designed to be brought into mechanical engagement with each other, and during mechanical engagement the first connection region and the second connection region are arranged adjacent to each other in such a manner that the first electrical connector and the second electrical connector establish a mutual electrical connection to couple the at least one electrical device to the at least one wall; and wherein the universal base plate and the universal rear wall are configured to be mechanically fixed together with a force that has a direction parallel to the direction of mechanical engagement;

wherein the universal base plate in the first connection region comprises a first recess in which the first electrical connector is arranged, and the universal rear wall in the second connection region comprises a second recess in which the second electrical connector is arranged;

wherein the first recess is arranged in a first flange that extends at an angle from the universal base plate; and wherein the second recess is arranged in a second flange that extends at an angle from the universal rear wall;

wherein the universal base plate comprises at least one first engagement means, and the universal rear wall comprises at least one second engagement means that is designed so as to correspond to the first engagement means, wherein the first engagement means and second engagement means are designed to mechanically engage each other; and wherein one of the first engagement means and second engagement means is an attachment hook, and the respective other of the first engagement means and second engagement means is a corresponding hook recess into which the attachment hook is insertable.

13. The vehicle according to claim 12, wherein the at least one first guide element and second guide element are designed to provide guidance to a movement parallel to the extension of the universal rear wall on the universal base plate in order to prevent the occurrence of any offset between the first electrical connector and the second electrical connector.

14. The vehicle according to claim 12, wherein the universal base plate comprises a first tensioning means that corresponds to a second tensioning means on the universal rear wall in such a manner that during engagement of the universal base plate and the universal rear wall the first tensioning means and the second tensioning means create tension between the universal base plate and the universal rear wall.

* * * * *